(12) United States Patent
Trela et al.

(10) Patent No.: US 11,495,982 B2
(45) Date of Patent: Nov. 8, 2022

(54) SYSTEM AND METHOD FOR ALLOCATING PROPULSION LOAD POWER DRAWN FROM HIGH-ENERGY AND HIGH-POWER BATTERIES

(71) Applicant: The Boeing Company, Chicago, IL (US)

(72) Inventors: John A. Trela, Seattle, WA (US); Mehdy Barekatein, Kirkland, WA (US); Glen M. Brown, Woodinville, WA (US); Shengyi Liu, Sammamish, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 17/395,032

(22) Filed: Aug. 5, 2021

(65) Prior Publication Data

US 2022/0069605 A1    Mar. 3, 2022

Related U.S. Application Data

(60) Provisional application No. 63/072,759, filed on Aug. 31, 2020.

(51) Int. Cl.
*H02J 7/00* (2006.01)
*G01R 31/392* (2019.01)
(Continued)

(52) U.S. Cl.
CPC ............ *H02J 7/0063* (2013.01); *B64D 27/24* (2013.01); *G01R 31/382* (2019.01);
(Continued)

(58) Field of Classification Search
CPC ........ H02J 7/0063; H02J 1/106; H02J 7/0048; H02J 7/005; H02J 7/0025; H02J 7/0024;
(Continued)

(56) References Cited

U.S. PATENT DOCUMENTS 8,760,094 B2   6/2014   Solodovnik et al.
9,846,199 B2   12/2017  Vian et al.
(Continued)

FOREIGN PATENT DOCUMENTS

WO    2020044134 A1    3/2020

OTHER PUBLICATIONS

European Examination Report dated Jan. 27, 2022, in European Patent Application No. 21193667.9 (European counterpart of the instant U.S. patent application).

*Primary Examiner* — Carlos Amaya
(74) *Attorney, Agent, or Firm* — Ostrager Chong Flaherty & Broitman, P.C.

(57) ABSTRACT

System and method for allocating load power drawn from multiple batteries for powering propulsion of a vehicle. The system includes: high-energy and high-power batteries respectively designed for optimal production of DC power during high-specific-energy and high-specific-power propulsion; and battery health management systems configured to monitor state of charge and state of health of the batteries and generate battery status signals. The system further includes a propulsion load configured to produce propulsion force using power converted from power generated by at least one of the batteries and a system controller configured to allocate load power drawn from the high-energy and high-power batteries for use by the propulsion load in dependence on a propulsion phase of the vehicle and the battery status.

20 Claims, 8 Drawing Sheets

(51) Int. Cl.
    *G01R 31/396*     (2019.01)
    *G01R 31/382*     (2019.01)
    *H02J 1/10*     (2006.01)
    *B64D 27/24*     (2006.01)
    *H02P 27/06*     (2006.01)

(52) U.S. Cl.
CPC ......... *G01R 31/392* (2019.01); *G01R 31/396* (2019.01); *H02J 1/106* (2020.01); *H02J 7/005* (2020.01); *H02J 7/007* (2013.01); *H02J 7/0024* (2013.01); *H02J 7/0025* (2020.01); *H02J 7/0048* (2020.01); *H02P 27/06* (2013.01); *B64D 2221/00* (2013.01)

(58) Field of Classification Search
CPC ..... H02J 7/007; G01R 31/392; G01R 31/396; G01R 31/382; B64D 27/24; B64D 2221/00; H02P 27/06
See application file for complete search history.

(56) References Cited

U.S. PATENT DOCUMENTS

| | | |
|---|---|---|
| 10,283,982 B2 | 5/2019 | Namou et al. |
| 10,330,739 B2 | 6/2019 | Quiambao et al. |
| 10,389,227 B2 | 8/2019 | Hokazono et al. |
| 10,473,710 B2 | 11/2019 | Sullivan |
| 2014/0104734 A1 | 4/2014 | Prisse et al. |
| 2014/0265554 A1 | 9/2014 | Yang et al. |
| 2015/0311832 A1 | 10/2015 | Solodovnik et al. |
| 2017/0279287 A1 | 9/2017 | Solodovnik et al. |
| 2018/0339781 A1 | 11/2018 | Vander Lind et al. |
| 2019/0123542 A1 | 4/2019 | Kambham |
| 2019/0337409 A1* | 11/2019 | Demont .................. B60L 50/40 |
| 2020/0274203 A1* | 8/2020 | Kirleis ................ H01M 10/482 |

* cited by examiner

SYSTEM AND METHOD FOR ALLOCATING PROPULSION LOAD POWER DRAWN FROM HIGH-ENERGY AND HIGH-POWER BATTERIES

RELATED PATENT APPLICATION

This application claims the benefit, under Title 35, United States Code, Section 119(e), of U.S. Provisional Application No. 63/072,759 filed on Aug. 31, 2020.

BACKGROUND

This disclosure generally relates to hybrid electric and fully electric systems that depend on battery technology for providing electrical power to a connected load, such as a propulsion load for an aircraft or other vehicle.

As used herein, the term "propulsion load" means an electric propulsor that consumes (active) electric power. This is opposed to a power source, such as a battery, which produces power. As used herein, the term "load power" refers to the power drawn from the battery and consumed by the electric propulsor. As used herein, the term "connected" in the context of a battery means that the battery is coupled for supplying load power and the term "disconnected" means the battery is de-coupled to not supply load power.

Some aircraft have electrically powered propulsion systems (hereinafter "electric aircraft"). In such aircraft, electric motors convert electrical power into mechanical power for use by the propulsion system. For example, an electric motor may turn one or more propellers on the aircraft to provide thrust. An electric aircraft may take various forms. For example, the electric aircraft may be an aircraft, a rotorcraft, a helicopter, a quadcopter, an unmanned aerial vehicle, or some other suitable type of aircraft.

When electric motors are used for propulsion of an aircraft or other vehicle, electrical energy is supplied by a power source. For instance, electrical energy may be supplied by a DC power source that includes a "battery" connected between positive and negative high-voltage direct-current (HVDC) busbars. As used herein, the term "high voltage" in the context of direct current means any DC voltage greater than 270 $V_{DC}$. The battery supplies electrical power to an electric motor that is arranged to convert electrical power into mechanical power for use by the propulsion system of the aircraft or other vehicle.

Some electric propulsion vehicles have a hybrid electric power architecture (e.g., hybrid electric aircraft) in which at least two different types of power sources are connected in parallel to a propulsion load. The electrical energy sources will often have different electrical characteristics. For example, the electrical energy sources may be a battery and an electric generator driven by an internal combustion engine or a gas turbine engine.

For future hybrid electric and fully electric systems that depend on advanced battery technologies, one of the limiting factors is the specific energy of the batteries. (As used herein, the term "specific energy" means the battery energy capacity per unit weight.) Several battery cell manufacturers are working on technologies that enable a specific energy in excess of 350 Wh/kg, but such technologies tend to have performance limitations such as high specific power capabilities. (As used herein, the term "specific power" indicates loading capability in watts per unit weight.) The battery is typically sized for both energy and power, which leads to an oversized and heavy battery. If the power demands are greater than the capabilities of the cell technology, the designer must increase the battery size to meet the requirements or use a different cell technology that has better power capability but lower specific energy.

For future hybrid electric and fully electric systems that depend on advanced battery technologies, a lightweight, high-performance battery is wanted.

SUMMARY

The subject matter disclosed in some detail below is directed to a system and methods for allocating load power drawn from a battery system including multiple batteries having different designs for powering propulsion of a vehicle. The designs of the separate batteries are optimized to minimize the overall battery weight while meeting the power demands of different operational modes. In accordance with one embodiment, the battery system includes one battery that is designed for optimal performance during high-specific-energy propulsion (hereinafter "HE battery") and another battery that is designed for optimal performance during high-specific-power propulsion (hereinafter "HP battery"). The overall system further includes a system controller that is configured to enable the battery system to have an optimal performance and reduced weight while avoiding oversizing the battery system to handle peak loads.

More specifically, the system controller is configured to allocate load power drawn from the HE and HP batteries and then control multiple DC-to-AC converters that supply AC power to respective AC-powered devices (e.g., electric propulsors). In the case of a vehicle, the system controller is configured to adjust the load power allocation in accordance with changing power demands during propulsion of a vehicle. In at least some cases, the load power drawn by the device is allocated to the HE and HP batteries as a function of the mode of operation of the vehicle (e.g., the flight phase of an aircraft).

In accordance with one embodiment, the system controller is configured to determine the amount of DC power to be provided by the HE battery versus the amount of DC power to be provided by the HP battery in a particular operational mode. The system controller receives information indicating the system electrical power demands and then determines how to allocate the load power to be drawn from the HE and HP batteries in order to meet the power demand. In order to make such determination, the system controller needs to know the status and health of the HE and HP batteries (e.g., state of charge, age, impedance, power capability, temperature, etc.). Each of the HE and HP batteries has associated therewith a respective dedicated state of charge (SOC) and state of health (SOH) monitoring/management system (hereinafter "SOC/SOH manager") which is connected to the system controller. The SOC/SOH managers send battery status signals to and receive command signals from the system controller. The respective load power drawn from the HE and HP batteries during the various phases of a mission are allocated by the system controller, which controls respective DC voltage conversion systems that receive high-voltage DC power from the HE and HP batteries. The resulting DC power may then be converted to AC power for use by one or more AC-powered devices (e.g., AC motors).

In accordance with one proposed implementation, each of the HE and HP batteries may consist of a respective battery pack. As used herein, the term "battery pack" means one or more battery modules wired in series, parallel, or a mixture thereof, each battery module consisting of a multiplicity of battery cells. For example, the HE battery may be a first battery pack managed by a first SOC/SOH manager, while the HP battery may be a second battery pack managed by a second SOC/SOH manager. The SOC/SOH managers may be respective processors or computers or respective modules hosted by a computer. In either case, means are provided for communicating SOC and SOH data acquired by the SOC/SOH managers to the system controller. The system controller and SOC/SOH managers may be components of a battery health management system equipped with other components configured to perform various disconnect and protection functions in response to the occurrence of faults (e.g., a short circuit) in a battery pack.

Although various embodiments of systems and methods for allocating load power drawn from HE and HP batteries for powering propulsion of a vehicle will be described in some detail below, one or more of those embodiments may be characterized by one or more of the following aspects.

One aspect of the subject matter disclosed in detail below is a system for allocating load power drawn from a battery system for powering propulsion of a vehicle, the system comprising: a high-energy battery that is designed for optimal production of DC power during high-specific-energy propulsion; a high-energy battery health management system that is configured to monitor a state of charge and a state of health of the high-energy battery and generate first battery status signals representing the state of charge and state of health of the high-energy battery; a high-power battery that is designed for optimal production of DC power during high-specific-power propulsion; a high-power battery health management system that is configured to monitor a state of charge and a state of health of the high-power battery and generate second battery status signals representing the state of charge and state of health of the high-power battery; a propulsion load configured to produce propulsion force using power converted from power generated by at least one of the high-energy and high-power batteries; and a system controller that is configured to receive the first and second battery status signals and then allocate load power drawn from the high-energy and high-power batteries for use by the propulsion load in dependence on a propulsion phase of the vehicle and the status of the high-energy and high-power batteries as represented by the first and second battery status signals.

In accordance with one embodiment of the system described in the immediately preceding paragraph, the vehicle is an aircraft, the propulsion phase is flight phase, and the system controller is configured to: (1) allocate respective load power to be drawn from the high-energy and high-power battery during high-demand periods, such as the high-power phase (which includes takeoff, climb, and second climb) of the aircraft; and (2) allocate a first load power to be drawn from the high-energy battery (while not allocating any load power to the high-power battery) during lower-demand periods, such as a cruise phase (which includes cruise and hover) of the aircraft and a second load power to be drawn from the high-energy battery for charging the high-power battery.

Another aspect of the subject matter disclosed in detail below is a computer-implemented method for allocating load power drawn from a battery system for powering propulsion of a vehicle, the battery system including a high-energy battery that is designed for optimal production of DC power during high-specific-energy propulsion and a high-power battery that is designed for optimal production of DC power during high-specific-power propulsion. The method comprises: (a) monitoring a state of charge and a state of health of the high-energy battery; (b) generating first battery status signals representing the state of charge and state of health of the high-energy battery; (c) monitoring a state of charge and a state of health of the high-power battery; (d) generating second battery status signals representing the state of charge and state of health of the high-power battery; and (e) allocating load power drawn from the high-energy and high-power batteries in dependence on a propulsion phase of the vehicle and the status of the high-energy and high-power batteries as represented by the first and second battery status signals.

A further aspect of the subject matter disclosed in detail below is a system for allocating load power drawn from a battery system for powering propulsion of a vehicle, the system comprising: a DC power distribution bus; a first DC voltage conversion system connected to the DC power distribution bus; a high-energy battery connected to the first DC voltage conversion system, the high-energy battery being designed for optimal production of DC power during high-specific-energy propulsion; a high-energy battery health management system that is configured to monitor a state of charge and a state of health of the high-energy battery and generate first battery status signals representing the state of charge and state of health of the high-energy battery; a second DC voltage conversion system connected to the DC power distribution bus; a high-power battery connected to the second DC voltage conversion system, the high-power battery being designed for optimal production of DC power during high-specific-power propulsion; a high-power battery health management system that is configured to monitor a state of charge and a state of health of the high-power battery and generate second battery status signals representing the state of charge and state of health of the high-power battery; and a system controller that is configured to receive the first and second battery status signals and send commands to the first and second DC voltage conversion systems which allocate load power drawn from the high-energy and high-power batteries in dependence on a propulsion phase of the vehicle and the status of the high-energy and high-power batteries as represented by the first and second battery status signals. In accordance with some embodiments, the system further comprises: a first DC-to-AC converter connected to the DC power distribution bus; a first propulsion load connected to receive AC power from the first DC-to-AC converter; a second DC-to-AC converter connected to the DC power distribution bus; and a second propulsion load connected to receive AC power from the second DC-to-AC converter, wherein the system controller is further configured to send commands to the first and second DC-to-AC converters for controlling the respective amounts of AC power and the frequencies provided to the first and second propulsion loads.

Other aspects of systems and methods for allocating load power drawn from HE and HP batteries for powering propulsion of a vehicle are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. In the drawings, rectangles drawn in solid lines indicate that a component that has been activated, whereas rectangles drawn in dashed lines indicate a component that has been deactivated.

Reference will hereinafter be made to the drawings in which similar elements in different drawings bear the same reference numerals.

DETAILED DESCRIPTION

Illustrative embodiments of systems and methods for allocating load power drawn from HE and HP batteries for powering propulsion of a vehicle are described in some detail below. However, not all features of an actual implementation are described in this specification. A person skilled in the art will appreciate that in the development of any such embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

For the purpose of illustration, a system for allocating load power drawn from multiple batteries for powering propulsion of an electric aircraft is described below. However, the technology proposed herein is not limited in its application to aircraft and may also be applied in propulsion of other types of electric vehicles, such as automobiles, industrial trucks, and trains.

Figure 1:
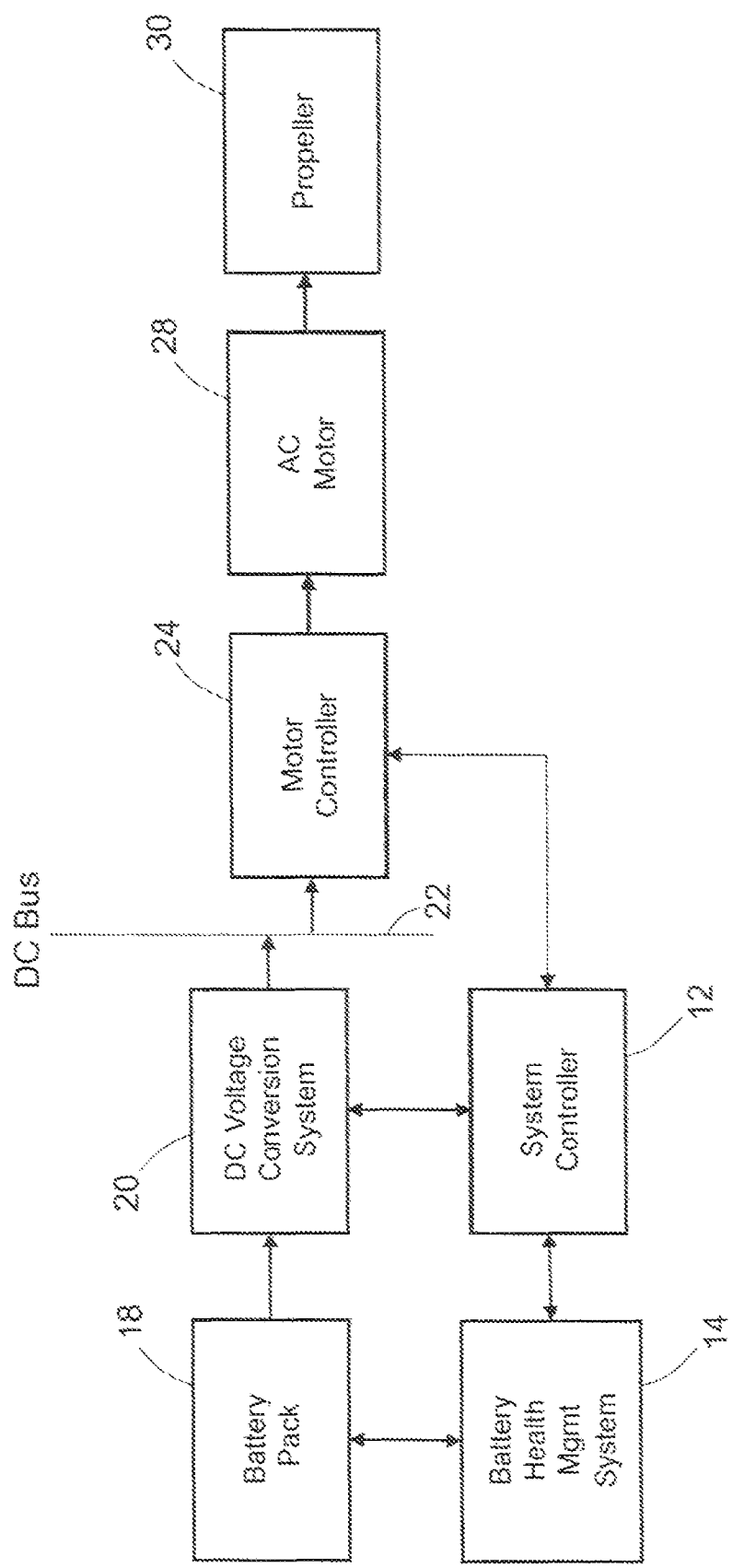
FIG. 1 is a block diagram identifying components of typical aerospace electric propulsion system architecture with a single propulsor.

FIG. 1 is a block diagram identifying components of a typical aerospace electric propulsion system architecture with a single propulsor. The propulsor is formed in part by a motor controller 24 that converts DC power to AC power, an AC motor 28 that receives AC power from motor controller 24, and a propeller 30 which is driven to rotate by the AC motor 28. The propeller 30 includes a propeller shaft (not shown in FIG. 1) which is mechanically coupled to the output shaft (not shown in FIG. 1) of the AC motor 28 and a plurality of propeller blades (not shown in FIG. 1).

In some implementations, the motor controller 24 has three channels for providing AC current to respective sets of stator windings in the AC motor 28. Each channel of the motor controller 24 comprises a respective inverter (not shown in FIG. 1) having power switches and a respective inverter controller (not shown in FIG. 1) which controls the states of the power switches (collectively referred to herein as "inverters/controllers"). The inverters are connected to windings (not shown in FIG. 1) of the AC motor 28. The operation of inverters is controlled by the inverter controllers, which send switch control signals to and receive switch state signals from the inverters via switch signal lines (not shown in FIG. 1). The inverters convert DC power into multi-phase AC power for the AC motor 28.

In the system depicted in FIG. 1, the HVDC power source is a battery 18. For example, the battery 18 may include a multiplicity of battery modules (not shown in FIG. 1) arranged to form a battery pack. Each battery module is a parallel/series arrangement of individual cells. Each battery module may be monitored by an associated module monitoring unit (not shown in FIG. 1). Each module monitoring unit includes sensors for independently measuring virtual cell voltage and individual cell temperature. The module monitoring unit also includes balancing circuits.

The system depicted in FIG. 1 further includes a DC voltage conversion system 20 that is configured to receive low-voltage DC power from battery 18 and convert that low-voltage DC power to high-voltage DC power. The DC voltage conversion system 20 comprises a converter controller and a voltage converter (collectively referred to herein as "converter/controller"). The converter controller generates control signals according to specific switching modulation algorithms, for example, pulse width modulation, phase shift modulation, and interleaved modulation, or a combination of two or three, etc. The voltage converter is controlled by the converter controller using one of the aforementioned specific modulation methods to convert an input electrical current at an input voltage to an output electrical current at an output voltage while achieving specific electric performance requirements, for example, in terms of efficiency improvement, current ripple reduction, noise minimization, etc.

The system depicted in FIG. 1 further includes a DC power distribution bus 22 ("DC bus 22" in FIG. 1) that is connected to receive high-voltage DC power from the DC voltage conversion system 20. The motor controller 24 in turn receives high-voltage DC power from the DC power distribution bus 22.

The system depicted in FIG. 1 also includes a battery health management system 14. The operation of the battery 18 is managed by the battery health management system 14. Each module monitoring unit incorporated in the battery 18 communicates sensor data representing virtual cell voltage and individual cell temperature to the battery health management system 14. The battery health management system 14 may be configured to ensure redundant protections, fail-safe operation, and selective shutdown of battery strings. The battery health management system 14 may be further configured to provide battery overcharge protection or to forestall other events or combination of events that could lead to battery thermal runaway. More specifically, the switching states of contactors (not shown in FIG. 1) are controlled by battery health management system 14 to open in response to detection of a fault condition (e.g., a short circuit).

As seen in FIG. 1, the system further includes a system controller 12. The system controller 12 interfaces with battery health management system 14. The inverter controllers (not shown in FIG. 1) of motor controller 24 are communicatively coupled to receive control signals from system controller 12 and send feedback signals to system controller 12. The system controller 12 performs a role of supervision and coordination for all inverter controllers. The system controller 12 also receives pilot thrust and pitch inputs from a thrust control lever and a pitch control lever (neither of which are shown in FIG. 1). The system controller 12 supervises and coordinates operation of the inverter controllers based on information from sensors and the pilot inputs.

Instead of the electric propulsion system with single battery 18 depicted in FIG. 1, this disclosure proposes an improved electric propulsion system that includes integrated HE and HP batteries (e.g., battery packs) that are designed to minimize the battery weight while meeting the power demands of different operational modes of an electric propulsion system. The HE battery is designed for optimal production of DC power during high-specific-energy propulsion; the HP battery is designed for optimal production of DC power during high-specific-power propulsion. A high-specific-energy propulsion is typically associated with a relatively low-power-demand case for which the high-specific-energy battery provides a low-weight advantage. The HP battery, with a relatively lower specific energy (~200 Wh/kg), allows a discharge rate of more than 5C, while the HE battery, with a relatively higher specific energy (~400 Wh/kg), typically allows a 1C rate to maintain healthy battery operation. (In describing batteries, discharge current is often expressed relative to a C-rate in order to normalize against battery capacity. A C-rate is a measure of the rate at which a battery is discharged relative to its maximum capacity.) Therefore, incorporating a HP battery is especially beneficial in high-power-demand modes (e.g., during takeoff and climb of an aircraft). The HE and HP batteries are separately controlled, but coordinated by the system controller. THE battery design proposed herein ensures appropriate allocation of the respective loads drawn from HE and HP batteries upon load demand and under system controller command.

Figure 2:
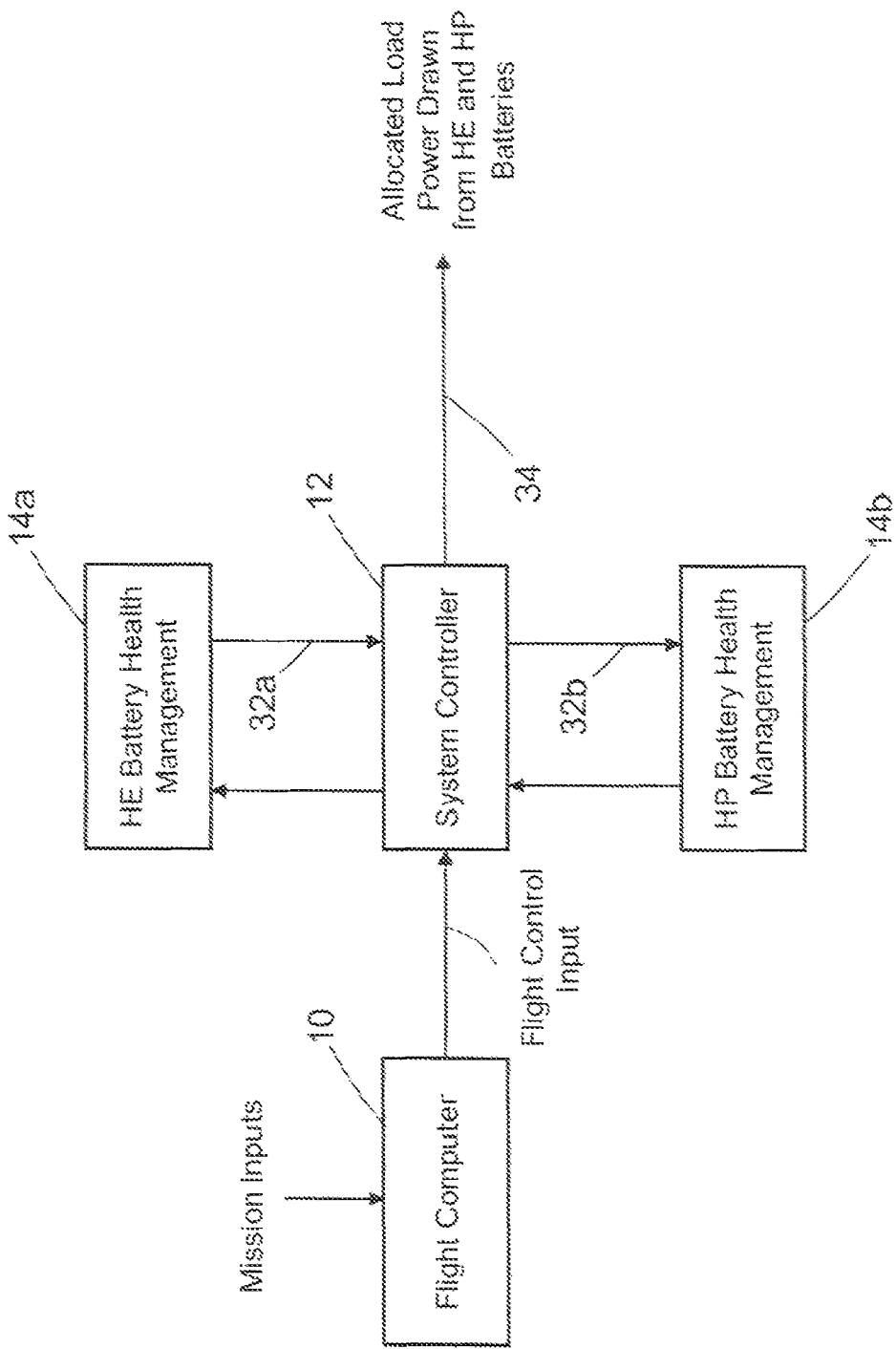
FIG. 2 is a block diagram showing architecture for a system designed to allocate load power drawn from a battery system in accordance with one embodiment.

FIG. 2 is a block diagram showing an architecture for a system designed to allocate load power drawn from HE and HP batteries (not shown) by propulsors of an aircraft (not shown). The system depicted in FIG. 2 includes a HE battery health management system 14a that is configured to monitor a state of charge and a state of health of the HE battery and generate first battery status signals 32a representing the state of charge and state of health of the HE battery and a HP battery health management system 14b that is configured to monitor a state of charge and a state of health of the HP battery and generate second battery status signals 32b representing the state of charge and state of health of the HP battery.

Each battery health management system includes sensors for monitoring various properties of each battery cell, such as cell voltage, cell current, and cell temperature. The voltage, current, and temperature sensors are connected to respective analog-to-digital converters which take battery data in analog form from the different sensors and convert that battery data to a digital output and then send the digital output to a processor unit (e.g., an SOC/SOH manager). The processor unit may be a processor, a microcontroller, a plurality of processors, a multi-core processor, and/or a microprocessor. The processor unit is configured to process the sensor data and derive battery performance information, such as battery voltage, battery current, battery temperature, state of charge, and state of health of each battery unit. At a given time, a battery has a maximum energy storage potential. The maximum energy storage potential may change over time. State of charge is a comparison between the amount of energy stored in the battery against the maximum amount of energy which the battery is currently able to store. State of health is the health of the battery as determined by detecting, predicting, and isolating different anomalies, which may include but is not limited to capacity degradation, unusual temperature behavior, charge loss, internal resistance change, pressure anomaly, dimension change, etc. State of health is the comparison of the aforementioned parameters against their values when the battery was new.

The system further includes a system controller 12 that is connected to a flight computer 10 and to the HE and HP battery health management systems 14a and 14b. The flight computer 10 receives mission inputs, such as destination, flight conditions, restricted airspace, reserve fuel, etc. and then outputs flight data pertinent to propulsion control to the system controller 12. The arrow labeled "flight control input" in FIG. 2 represents the communication of that flight data to system controller 12. The system controller 12 also receives the first and second battery status signals 32a and 32b from the HE and HP battery health management systems 14a and 14b. The system controller 12 is configured to allocate load power drawn from the HE and HP batteries for use by the propulsion load in dependence on a flight phase of the aircraft (represented by the flight control input) and the status of the HE and HP batteries (represented by the battery status signals). The system controller 12 allocates the load power drawn by sending control signals 34 to respective DC voltage conversion systems.

Figure 3:
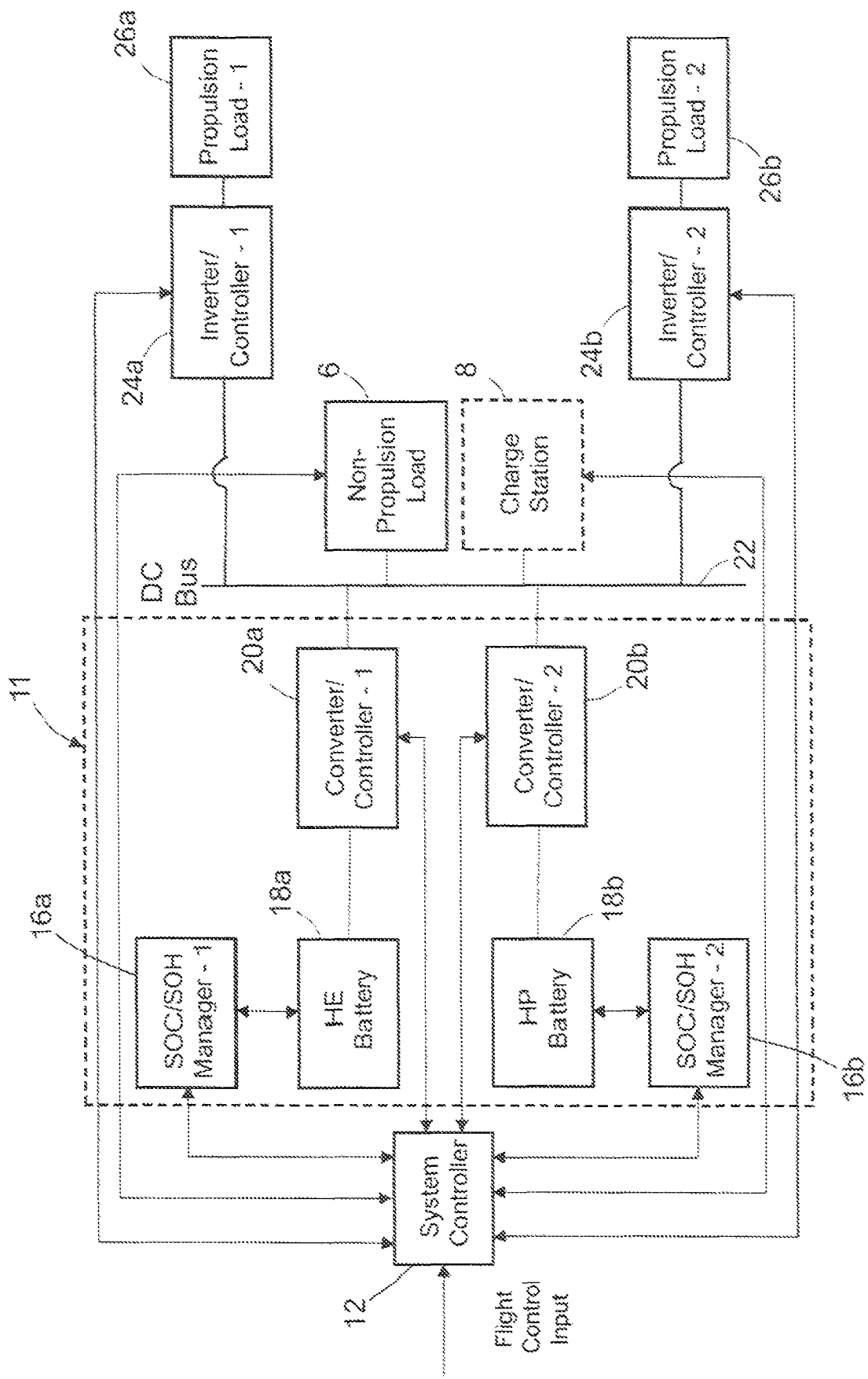
FIG. 3 is a block diagram identifying components of a system for allocating load power drawn from high-energy and high-power batteries for powering propulsion of an aircraft in accordance with one embodiment.

FIG. 3 is a block diagram identifying components of a system for allocating load power drawn from a battery system 11 to a DC power distribution bus 22 for powering propulsion of a vehicle in accordance with one embodiment. Operation of the overall system is controlled by a system controller 12, which is communicatively coupled to various components of the battery system 11.

The battery system 11 includes HE and HP batteries 18a and 18b which are connected in parallel to the DC power distribution bus 22 to provide one-fault tolerance. The HE battery 18a is designed for optimal production of DC power during high-specific-energy propulsion; the HP battery 18b is designed for optimal production of DC power during high-specific-power propulsion. The battery system 11 further includes: DC voltage converter/controller 20a of a DC voltage conversion system connected to HE battery 18a and to DC power distribution bus 22; and DC voltage converter/controller 20b of a second DC voltage conversion system connected to HP battery 18b and to the DC power distribution bus 22. Each DC voltage converter/controller sends feedback signals to and receives a command signal from the system controller 12, and executes a specific charge or discharge control algorithm at appropriate current, voltage and power levels. Each converter/controller-connected battery provides a stable, tight and narrow band of DC bus voltages, which allows lighter weight of distribution, protection, and load equipment.

Battery system 11 also includes a HE battery health management system comprising a first SOC/SOH manager 16a configured to monitor a state of charge and a state of health of the HE battery 18a and generate battery status signals representing the state of charge and state of health of the HE battery 18a; and a HP battery health management system comprising a second SOC/SOH manager 16b configured to monitor a state of charge and a state of health of the HP battery 18b and generate battery status signals representing the state of charge and state of health of the HP battery 18b. More specifically, the SOC/SOH managers 16a and 16*b* send battery status signals to and receive command signals from the system controller 12 (described below).

The system controller 12 is configured to process battery status signals received from SOC/SOH managers 16*a* and 16*b* and then send commands to DC voltage converter/controller 20*a* and DC voltage converter/controller 20*b*, which commands allocate load power drawn from HE and HP batteries 18*a* and 18*b*. The system controller 12 is configured (e.g., programmed) to determine an optimal load power allocation in dependence on at least a propulsion phase of the aircraft (as required by the flight control input) and the status of the HE and HP batteries 18*a* and 18*b* as represented by the first and second battery status signals. Other data may also be factored into the load allocation computation.

The system depicted in FIG. 3 further includes a first inverter/controller 24*a* of a first motor controller and a second inverter/controller 24*b* of a second motor controller. Each inverter/controller is configured to perform DC-to-AC conversion at the required frequency that controls the shaft speed of the motor-propulsor assembly of the propulsion load. Both motor controllers received DC power from the DC power distribution bus 22. A first propulsion load is connected to receive AC power from first inverter/controller 24*a*; a second propulsion load is connected to receive AC power from second inverter/controller 24*b*. The system controller 12 is further configured to send commands to the inverter controllers for controlling the magnitude and frequency of AC power output. More specifically, each inverter/controller receives a command signal from and sends feedback signals to the system controller 12, and executes a specific DC-to-AC conversion algorithm to provide AC power at appropriate amplitudes and frequencies. The frequency of the AC power determines the speed of the motor shaft. The required propulsion speed is determined by the system controller 12.

On the load side, the example system depicted in FIG. 3 includes: a first propulsion load 26*a* connected to receive AC power from inverter/controller 24*a*; a second propulsion load 26*b* connected to receive AC power from inverter/controller 24*b*; a non-propulsion load 6 connected to receive DC power from DC power distribution bus 22; and a charge station 8 also connected to DC power distribution bus 22 for charging the batteries in a charging mode. The non-propulsion load 6 may be a composite load which may include multiple individual loads. All loads are commanded by the system controller 12.

The system controller 12 is configured to optimize the load power allocation once a specific mission profile has been received. For example, a typical mission profile consists of a cycle of operation modes (flight phases) such as taxi, takeoff, climb, cruise, descent/deceleration, landing, taxi, and reserve, where the reserve phase requires that the remaining battery energy be sufficient for a second climb and hover for a certain period of time before landing.

The power demand for the cruise phase is much lower than the power demand for the takeoff or climb phase, typically less than a half of the power in the takeoff/climb phase. The power requirement for other modes such as descent, landing, and taxi are even lower. Therefore, the system controller 12 is configured to control the DC voltage converters/controllers so that the load power for the cruise, descent, landing, and taxi phases be drawn from only the HE battery or optimally allocated between HE and HP batteries if needed.

Generally, two flight phases demand most of the stored energy from the battery system: (1) the high-power phase, which includes takeoff, climb, and second climb; and (2) the cruise phase including cruise and hover. The lower power phases such as descent, landing, taxi, and standby for control tower instructions can be considered within the cruise phase by adding an appropriate percentage of overhead. The overhead can be taken into account when an actual mission profile is given. Therefore, the high-power and cruise phases are the primary factors that affect the battery sizing during battery system design.

Figure 4:
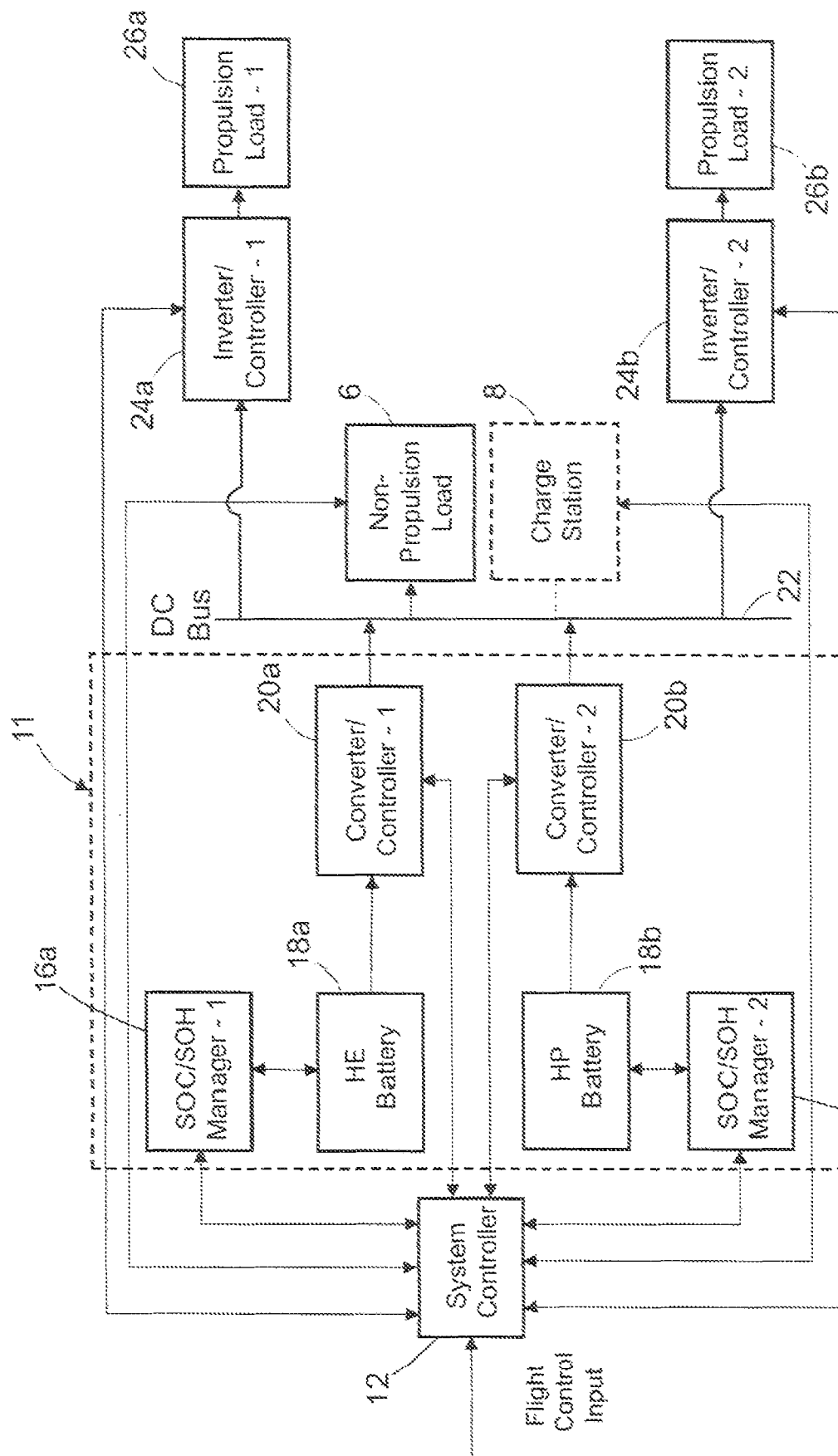
FIG. 4 is a flowchart indicating power flow during a takeoff or climb phase of an aircraft flight in accordance with a proposed implementation of the system depicted in FIG. 3.

FIG. 4 is a flowchart identifying stages of power flow during a takeoff or climb mode in accordance with one proposed implementation of the system depicted in FIG. 3. The arrow exiting the DC voltage converter/controller 20*a* represents the power flow from HE battery 18*a* to DC power distribution bus 22; the arrow exiting the DC voltage converter/controller 20*b* represents the power flow from HP battery 18*b* to DC power distribution bus 22. The load power demand is the highest during takeoff and climb. The battery system 11 is activated to discharge power respectively generated by HE and HP batteries 18*a* and 18*b* to the DC power distribution bus 22. However, the HP battery 18*b* provides a higher percentage of the total power than the percentage provided by the HE battery 18*a*. Specific allocation of the load power drawn from HE and HP batteries 18*a* and 18*b* is determined by the system controller 12 and implemented by the two sets of DC voltage converters/controllers 20*a* and 20*b*.

The functions of each DC voltage converter/controller 20*a* and 20*b* include the following: (1) receiving a commanding signal on the battery power output need from the system controller 12; (2) sending the power delivery status back to the system controller 12; and (3) providing a control and power conversion interface for the associated battery with the DC power distribution bus 22 during charge and discharge. In any operation mode (for example, during a climb phase), the system controller 12 (or flight control system) sends a power demand signal to each DC voltage converter/controller for a specific amount of power to deliver to the DC power distribution bus 22. So the load power allocation between the HE and HP batteries 18*a* and 18*b* is determined by the system controller 12. Each DC voltage power converter/controller then performs a specific control algorithm such that the required amount of power is delivered to the DC power distribution bus 22 accordingly.

Figure 5:
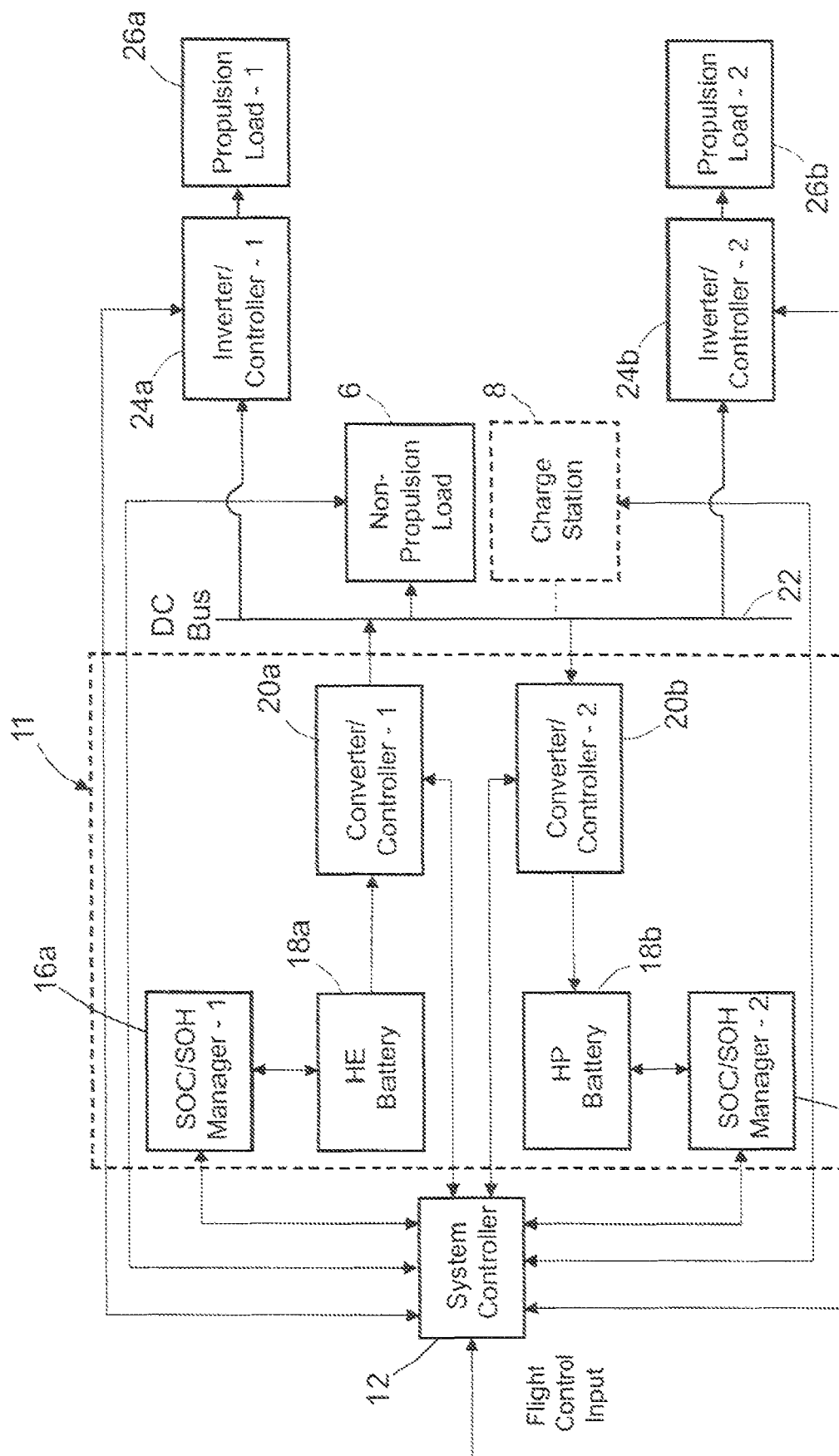
FIG. 5 is a flowchart indicating power flow during a cruise phase of an aircraft flight in accordance with a proposed implementation of the system depicted in FIG. 3.

FIG. 5 is a flowchart indicating power flow during a cruise phase of an aircraft flight in accordance with one proposed implementation of the system depicted in FIG. 3. During cruise, the load power demand is significantly reduced. The HE battery 18*a* provides power to all loads (as indicated by the arrow pointing from HE battery 18*a* to DC power distribution bus 22) under the control of system controller 12. In the meantime, the HE battery 18*a* also charges the HP battery 18*b* (as indicated by the arrow pointing from DC power distribution bus 22 to HP battery 18*b*) under the control of system controller 12. Depending on a specific design, the HP battery 18*b* may retain sufficient energy so that it can be deactivated during the cruise phase.

Figure 6:
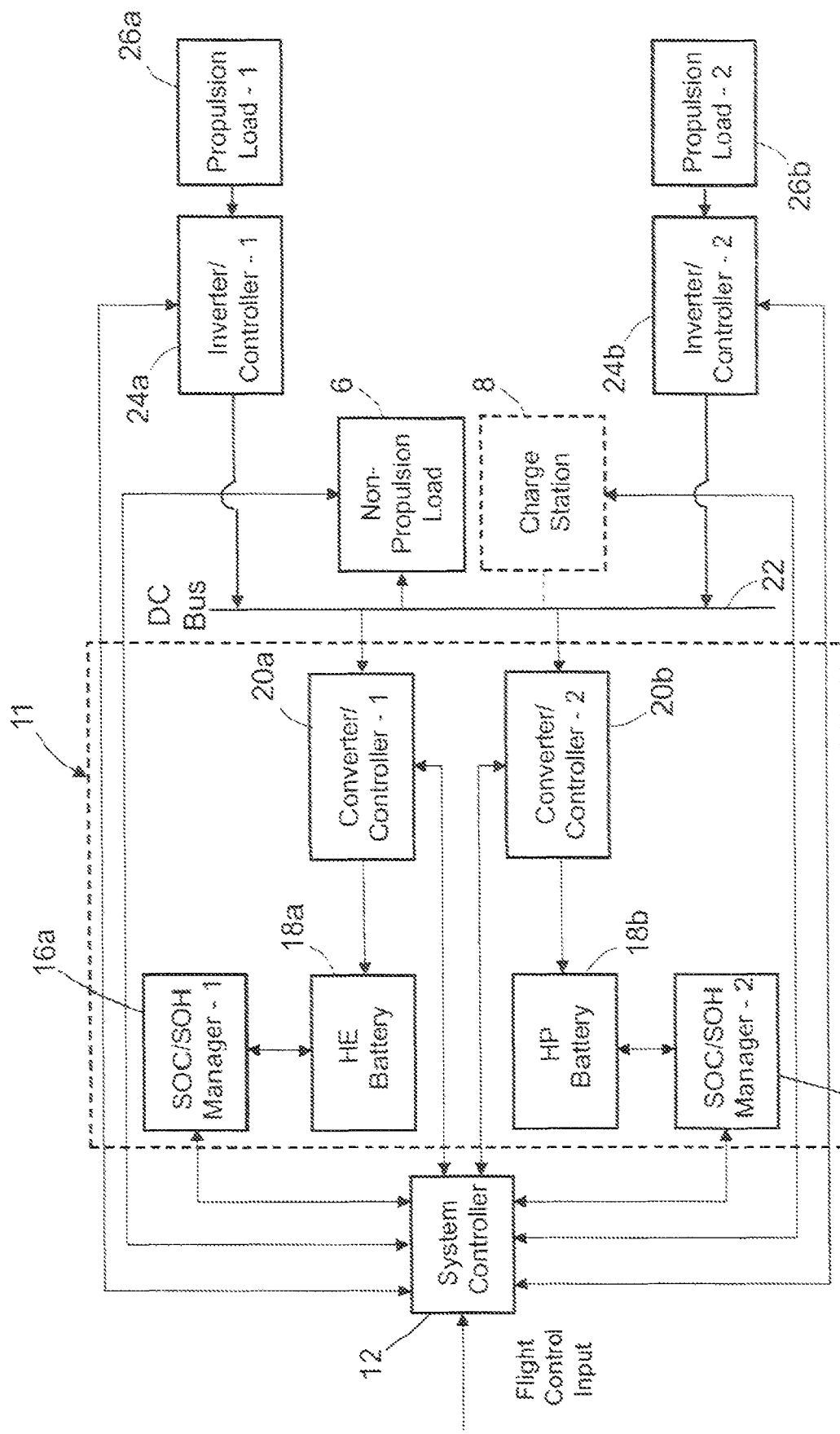
FIG. 6 is a flowchart indicating power flow during a descent/deceleration phase of an aircraft flight in accordance with a proposed implementation of the system depicted in FIG. 3.

FIG. 6 is a flowchart indicating power flow during a descent/deceleration phase of an aircraft flight in accordance with one proposed implementation of the system depicted in FIG. 3. In this case, regeneration is possible. In the descent phase, the plane uses a form of regenerative electric power, where each AC motor becomes a generator that is rotated by the propeller, allowing the batteries to partially recharge using the free energy provided by gravity and aerodynamic drag. Therefore, one battery or both batteries may collect the regenerative energy and be operated in a charging mode. The flow of power from inverter/controllers 24a and 24b to HE and HP batteries 18a and 18b is indicated in FIG. 6 by arrows pointing: (a) from inverter/controller 24a to DC power distribution bus 22; (b) from DC power distribution bus 22 to DC voltage converter/controller 20a; (c) from DC voltage converter/controller 20a to HE battery 18a; (d) from inverter/controller 24b to DC power distribution bus 22; (e) from DC power distribution bus 22 to DC voltage converter/controller 20b; and (f) from DC voltage converter/controller 20b to HP battery 18b.

Figure 7:
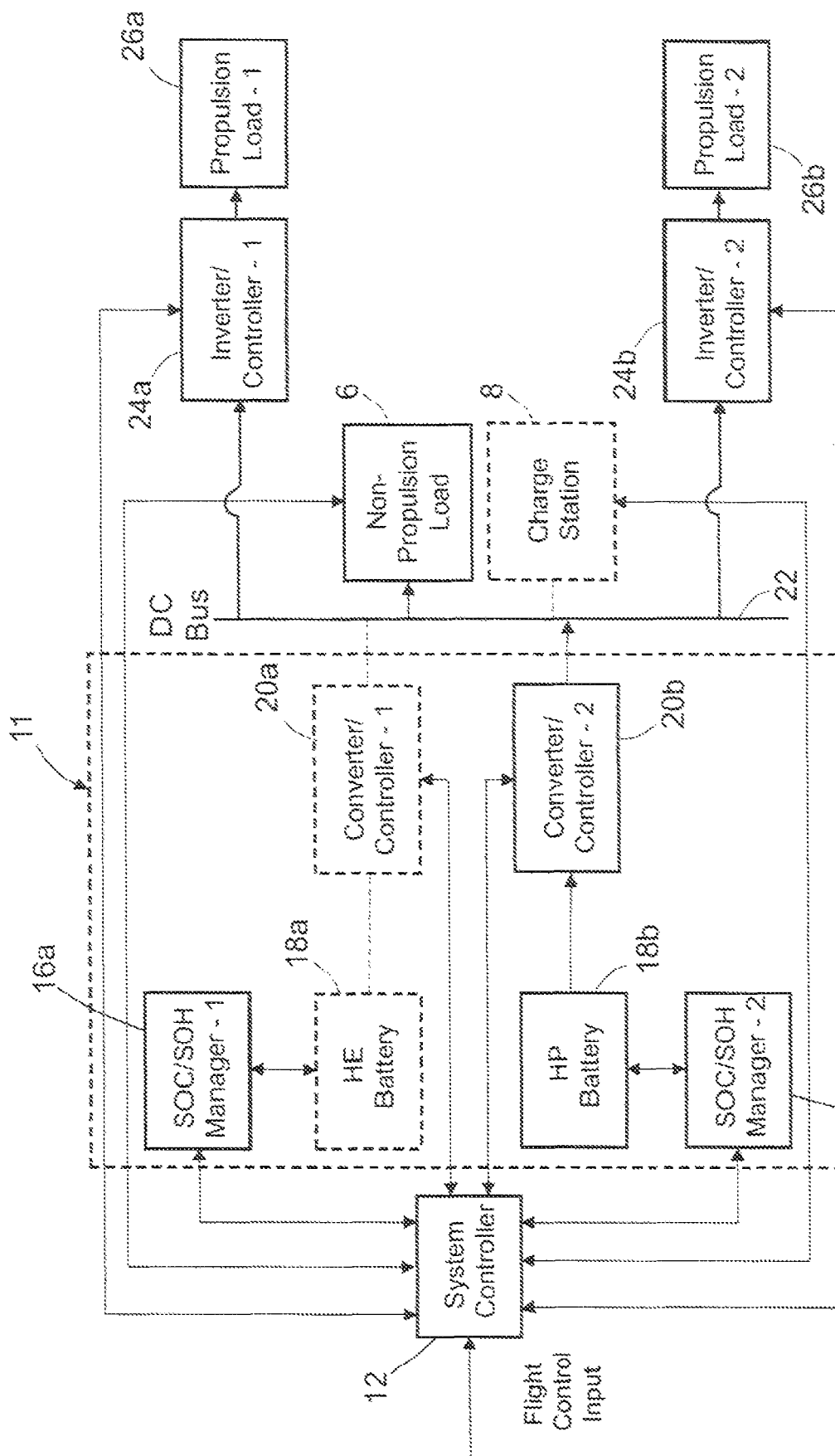
FIG. 7 is a flowchart indicating power flow while the system depicted in FIG. 3 is operating in a fault-tolerant mode.

FIG. 7 is a flowchart indicating power flow while the system depicted in FIG. 3 is operating in a fault-tolerant mode. If one battery is at a fault condition, the associated converter/controller deactivates and isolates the faulty battery from the DC power distribution bus 22. The healthy battery provides power to loads at a reduced power scale. In this case, load shedding for some non-essential loads may be necessary. In the example depicted in FIG. 7, the DC voltage converter/controller 20a has been deactivated and the HE battery 18a has been isolated (indicated by dashed boxes) in response to detection of a fault in the HE battery 16a by the SOC/SOH manager 16a.

Figure 8:
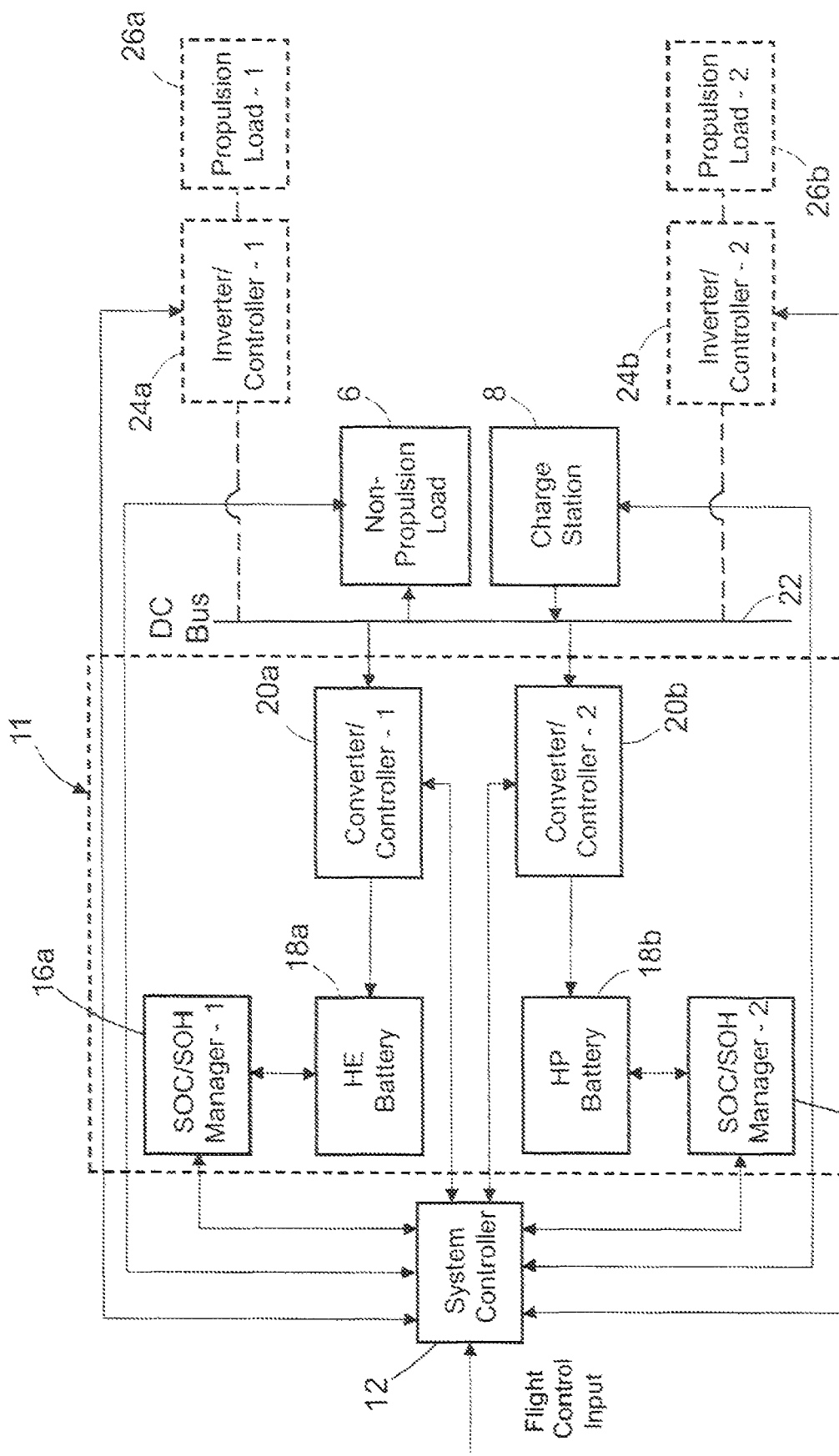
FIG. 8 is a flowchart indicating power flow while the system depicted in FIG. 3 is operating in a ground charging mode.

FIG. 8 is a flowchart indicating power flow while the system depicted in FIG. 3 is operating in a ground charging mode. At a ground charging mode, all propulsion loads are deactivated. Some non-propulsion loads may also be deactivated. In this case, the charge station 8 provides power (indicated by the arrow pointing from charge station 8 to DC power distribution bus 22) to charge the HE and HP batteries 18a and 18b under the control of the system controller 12.

The flowcharts and block diagrams in the different depicted embodiments illustrate the architecture, functionality, and operation of some possible implementations of apparatus and methods in an illustrative embodiment. In this regard, each block in the flowcharts or block diagrams may represent a module, segment, function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowcharts or block diagrams.

The embodiments disclosed above use one or more controllers. Such devices typically include a processor or computer, such as a central processing unit, a microprocessor, a reduced instruction set computer processor, an application specific integrated circuit, a programmable logic circuit, a field-programmable gate array, a digital signal processor, and/or any other circuit or processing device capable of executing the functions described herein.

The methods described herein may be encoded as executable instructions embodied in a non-transitory tangible computer-readable storage medium, including, without limitation, a storage device and/or a memory device. Such instructions, when executed by a processing or computing system, cause the system device to perform at least a portion of the methods described herein.

While systems and methods for allocating load power drawn from HE and HP batteries for powering propulsion of a vehicle have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

As used in the claims, the term "DC-to-AC converter" should be construed to encompass an inverter controlled by an inverter controller and structural equivalents thereof.

The invention claimed is:

1. A system for allocating load power drawn from a battery system for powering propulsion of an aircraft, the system comprising:
    a high-energy battery that is designed for optimal production of DC power during high-specific-energy propulsion;
    a high-energy battery health management system that is configured to monitor a state of charge and a state of health of the high-energy battery and generate first battery status signals representing the state of charge and state of health of the high-energy battery;
    a high-power battery that is designed for optimal production of DC power during high-specific-power propulsion;
    a high-power battery health management system that is configured to monitor a state of charge and a state of health of the high-power battery and generate second battery status signals representing the state of charge and state of health of the high-power battery;
    a propulsion load configured to produce propulsion force using power converted from power generated by at least one of the high-energy and high-power batteries;
    a flight computer configured to receive mission inputs and then output flight data pertinent to propulsion control; and
    a system controller that is configured to receive the flight data and the first and second battery status signals and then allocate load power drawn from the high-energy and high-power batteries for use by the propulsion load in dependence on a flight phase of the aircraft as represented by the flight data and the status of the high-energy and high-power batteries as represented by the first and second battery status signals.

2. The system as recited in claim 1, wherein the system controller is configured to allocate respective load power to be drawn from the high-energy and high-power battery during a takeoff phase of the aircraft.

3. The system as recited in claim 1, wherein the system controller is configured to allocate respective load power to be drawn from the high-energy and high-power battery during a climb phase of the aircraft.

4. The system as recited in claim 1, wherein the system controller is configured to allocate a first load power to be drawn from the high-energy battery while not allocating any load power to the high-power battery during a cruise phase of the aircraft.

5. The system as recited in claim 4, wherein the system controller is further configured to allocate a second load power to be drawn from the high-energy battery for charging the high-power battery while the first load power is being drawn.

6. The system as recited in claim 1, wherein the system controller is further configured to cause at least one of the high-energy and high-power batteries to partially recharge using free energy provided by gravity and aerodynamic drag during a descent phase of the aircraft.

7. The system as recited in claim 1, wherein the system controller is further configured to deactivate and isolate the high-energy battery and allocate a load power at a reduced power scale to be drawn from the high-power battery in response to first battery status signals indicating a fault condition in the high-energy battery.

8. The system as recited in claim 1, wherein the system controller is further configured to deactivate and isolate the high-power battery and allocate a load power at a reduced power scale to be drawn from the high-energy battery in response to second battery status signals indicating a fault condition in the high-power battery.

9. A computer-implemented method for allocating load power drawn from a battery system for powering propulsion of an aircraft, the battery system comprising a high-energy battery that is designed for optimal production of DC power during high-specific-energy propulsion and a high-power battery that is designed for optimal production of DC power during high-specific-power propulsion, the method comprising:
 (a) computing flight data pertinent to propulsion control based on mission inputs received by a flight computer onboard the aircraft;
 (b) monitoring a state of charge and a state of health of the high-energy battery;
 (c) generating first battery status signals representing the state of charge and state of health of the high-energy battery;
 (d) monitoring a state of charge and a state of health of the high-power battery;
 (e) generating second battery status signals representing the state of charge and state of health of the high-power battery; and
 (f) allocating load power drawn from the high-energy and high-power batteries in dependence on a flight phase of the aircraft as represented by the flight data and the status of the high-energy and high-power batteries as represented by the first and second battery status signals.

10. The computer-implemented method as recited in claim 9, wherein step (f) comprises allocating respective load power to be drawn from the high-energy and high-power battery during a takeoff phase of the aircraft.

11. The computer-implemented method as recited in claim 9, wherein step (f) comprises allocating respective load power to be drawn from the high-energy and high-power battery during a climb phase of the aircraft.

12. The computer-implemented method as recited in claim 9, wherein step (f) comprises allocating a first load power to be drawn from the high-energy battery while not allocating any load power to the high-power battery during a cruise phase of the aircraft.

13. The computer-implemented method as recited in claim 12, further comprising allocating a second load power to be drawn from the high-energy battery for charging the high-power battery while the first load power is being drawn.

14. The computer-implemented method as recited in claim 9, further comprising partially recharging at least one of the high-energy and high-power batteries using free energy provided by gravity and aerodynamic drag during a descent phase of the aircraft.

15. The computer-implemented method as recited in claim 9, further comprising deactivating and isolating the high-energy battery and allocating a load power at a reduced power scale to be drawn from the high-power battery in response to first battery status signals indicating a fault condition in the high-energy battery.

16. The computer-implemented method as recited in claim 9, further comprising deactivating and isolating the high-power battery and allocate a load power at a reduced power scale to be drawn from the high-energy battery in response to second battery status signals indicating a fault condition in the high-power battery.

17. A system for allocating load power drawn from a battery system for powering propulsion of an aircraft, the system comprising:
 a DC power distribution bus;
 a first DC voltage conversion system connected to the DC power distribution bus;
 a high-energy battery connected to the first DC voltage conversion system, the high-energy battery being designed for optimal production of DC power during high-specific-energy propulsion;
 a high-energy battery health management system that is configured to monitor a state of charge and a state of health of the high-energy battery and generate first battery status signals representing the state of charge and state of health of the high-energy battery;
 a second DC voltage conversion system connected to the DC power distribution bus;
 a high-power battery connected to the second DC voltage conversion system, the high-power battery being designed for optimal production of DC power during high-specific-power propulsion;
 a high-power battery health management system that is configured to monitor a state of charge and a state of health of the high-power battery and generate second battery status signals representing the state of charge and state of health of the high-power battery;
 a flight computer configured to receive mission inputs and then output flight data pertinent to propulsion control; and
 a system controller that is configured to receive the flight data and the first and second battery status signals and send commands to the first and second DC voltage conversion systems which allocate load power drawn from the high-energy and high-power batteries in dependence on a flight phase of the aircraft as represented by the flight data and the status of the high-energy and high-power batteries as represented by the first and second battery status signals.

18. The system as recited in claim 17, further comprising:
 a first DC-to-AC converter connected to the DC power distribution bus;
 a first propulsion load connected to receive AC power from the first DC-to-AC converter;
 a second DC-to-AC converter connected to the DC power distribution bus; and
 a second propulsion load connected to receive AC power from the second DC-to-AC converter,
 wherein the system controller is further configured to send commands to the first and second DC-to-AC converters for controlling the respective amounts of AC power and the frequencies provided to the first and second propulsion loads.

19. The system as recited in claim 1, wherein the each of the high-energy and high-power battery health management systems comprises:
 voltage, current, and temperature sensors for respectively monitoring cell voltage, cell current, and cell temperature;
 analog-to-digital converters which are connected to the voltage, current, and temperature sensors and configured to take sensor data in analog form from the voltage, current, and temperature sensors and convert that sensor data to a digital output; and a processor unit connected to receive the digital output from the (analog-to-digital converters and configured to process the sensor data to derive battery performance information, including battery voltage, battery current, battery temperature, state of charge, and state of health of each battery unit.

20. The computer-implemented method as recited in claim 9, wherein each of steps (b) and (d) comprises:
sensing cell voltage, cell current, and cell temperature;
converting sensor data in analog form from the voltage, current, and temperature sensors to a digital output; and
processing the sensor data to derive battery performance information, including battery voltage, battery current, battery temperature, state of charge, and state of health of each battery unit.

\* \* \* \* \*